US006707833B1

(12) United States Patent
Kimbrough

(10) Patent No.: US 6,707,833 B1
(45) Date of Patent: Mar. 16, 2004

(54) DIGITAL LASER DRIVER CIRCUIT

(75) Inventor: Mahlon D. Kimbrough, Bedford, TX (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/539,395

(22) Filed: Mar. 31, 2000

(51) Int. Cl.[7] .............................. H01S 3/13; H01S 3/00
(52) U.S. Cl. ............................. 372/38.02; 372/29.01; 372/29.011; 372/38.01; 372/38.007
(58) Field of Search ....................... 372/38.01, 38.02, 372/38.07, 29.01, 29.011

(56) References Cited

U.S. PATENT DOCUMENTS

| | | | |
|---|---|---|---|
| 4,553,268 A | 11/1985 | Tilly | |
| 4,757,193 A | 7/1988 | Kollanyi | |
| 5,019,769 A | 5/1991 | Levinson | |
| 5,313,482 A | 5/1994 | Zelenka et al. | |
| 5,349,595 A | 9/1994 | Ogawa et al. | |
| 5,373,387 A | * 12/1994 | Bosch et al. ................. | 359/187 |
| 5,383,208 A | 1/1995 | Queniat et al. | |
| 5,402,433 A | * 3/1995 | Stiscia .......................... | 372/31 |
| 5,408,485 A | * 4/1995 | Ries .............................. | 372/38 |
| 5,675,599 A | 10/1997 | Abe et al. | |
| 5,732,096 A | 3/1998 | Suzuki et al. | |
| 5,761,230 A | 6/1998 | Oono et al. | |
| 5,778,017 A | 7/1998 | Sato et al. | |
| 5,793,789 A | 8/1998 | Ben-Michael et al. | |
| 5,796,767 A | 8/1998 | Aizawa | |
| 6,002,699 A | 12/1999 | Gotoh | |
| 6,021,143 A | 2/2000 | Ransijn et al. | |
| 6,281,823 B1 | * 8/2001 | Gross, Jr. et al. ........... | 341/144 |

OTHER PUBLICATIONS

The Illustrated Dictionary of Electronics, McGraw–Hill, eighth edition.*
Patent Abstracts of Japan, vol. 013, No. 180 (P–864), Apr. 27, 1989 & JP 01 010430 A (Seiko Epson Corp), Jan. 13, 1989.
Patent Abstracts of Japan, vol. 1998, No. 02, Jan. 30, 1998 & JP 09 283848 A (NEC Corp), Oct. 31, 1997.
Patent Abstracts of Japan, vol. 1998, No. 02, Jan. 30, 1998 & JP 09 272223 A (Cannon Inc.) Oct. 21, 1997.

* cited by examiner

*Primary Examiner*—Paul Ip
*Assistant Examiner*—Armando Rodriguez
(74) *Attorney, Agent, or Firm*—Jones Day

(57) ABSTRACT

A digital laser driver circuit is provided in which a digital synthesizer synthesizes a modulation index signal for precisely setting the modulation level of the laser, and a pair of feedback loops control the average power level and modulation index of the laser diode. The laser diode includes a back-facet photodiode that is used to monitor the laser's average and peak optical power levels. The average power level is measured by an analog feedback loop and compared to an externally supplied reference voltage in order to maintain the laser at a particular average optical power level. The peak power is measured by a digital feedback loop and compared to a pair of threshold levels based on a ratio of the average power level using digital comparators. The comparators provide signals to the digital synthesizer in order to indicate that the modulation level is too low or too high. The digital synthesizer then re-synthesizes the laser modulation index signal to maintain the optical modulation between the two threshold levels.

8 Claims, 3 Drawing Sheets

DIGITAL LASER DRIVER CIRCUIT

BACKGROUND OF THE INVENTION

1. Technical Field

The present invention is directed toward the field of optical communication circuits using laser diodes. More specifically, the invention provides a digital laser driver circuit that is particularly well-suited for use in driving a laser diode for use with an optical communication system. As part of such a system, the laser diode is pulsed on and off at a very high frequency in order to communicate pulses of light over an optical fiber.

2. Description of the Related Art

Laser diodes and their associated driving circuitry are known in this field. Laser diodes are characterized by a temperature dependent threshold current $I_{TH}$, above which point the diode begins to act like a laser. FIG. 1, for example, is a plot 10 showing the typical light output (P) 12 v. current (I) 14 characteristic for a laser diode at two operating temperatures 16, 18. As seen in this plot 10, the laser diode threshold current $I_{TH}$ is lower $I_{TH1}$ at the lower temperature than at the higher temperature, where the threshold current is $I_{TH2}$. The Quantum Efficiency (QE) of the diode is characterized by the slope of the P v. I curve.

Simple laser driver circuits turn the laser diode on and off for each pulse of light to be transmitted over the fiber. FIG. 2 is a plot 20 showing a plurality of light pulses output from such a laser driver circuit. The y-axis in this plot shows light output (P) 22, and the x-axis shows time (t) 24. As seen in this plot 20, the problem with this type of simple on/off driver circuit is that it causes the laser diode to cross over the laser threshold current level ($I_{TH}$), which causes a ringing phenomenon 26 to occur on the output pulse that consists of a plurality of light spikes. These light spikes are caused by the laser transitioning from operating like a light emitting diode to operating like a laser. After a short burst, these spikes 26 subside, and the output pulse is relatively flat 28, until the pulse terminates.

In order to cure the problem shown in FIG. 2, more complex laser driver circuits have been used in this field that typically include two analog feedback loops. The first analog feedback loop regulates the laser diode's average light output and maintains the laser above the threshold current level ($I_{TH}$) even during off periods. This eliminates the ringing phenomenon shown in FIG. 2 since the diode is always above the threshold current. The second analog feedback loop is used to regulate the modulation index, and requires a complex gain control stage to adjust the laser diode's extinction ratio $E_R$. Often, these analog feedback circuits require temperature compensation thermistors and multiple factory adjustments to control the extinction ratio.

SUMMARY OF THE INVENTION

A digital laser driver circuit is provided in which a digital synthesizer synthesizes a modulation index signal for precisely setting the modulation level of the laser, and a pair of feedback loops control the average power level and modulation index of the laser diode. The laser diode includes a back-facet photodiode that is used to monitor the laser's average and peak optical power levels. The average power level is measured by an analog feedback loop and compared to an externally supplied reference voltage in order to maintain the laser at a particular average optical power level. The peak power is measured by a digital feedback loop and compared to a pair of threshold levels based on a ratio of the average power level using digital comparators. The comparators provide signals to the digital synthesizer in order to indicate that the modulation level is too low or too high. The digital synthesizer then re-synthesizes the laser modulation index signal to maintain the optical modulation between the two threshold levels.

One aspect of the invention provides a digital laser driver circuit for controlling the drive current to a laser diode having a back-facet monitor photodiode, comprising: (1) a current driver coupled to the laser diode; (2) an analog feedback loop coupled between the back-facet photodiode and the current driver for measuring the average power level of light output from the laser diode and for maintaining a constant optical power output level; and (3) a digital feedback loop coupled between the back-facet photodiode and the current driver for comparing the peak power level of light output from the laser diode to a ratio of the average power level and for synthesizing a laser modulation level to the current driver that keeps the peak power level between two average threshold levels.

Another aspect of the invention provides a digital laser communication circuit, comprising: a laser diode; a back-facet photodiode for monitoring the light output from the laser diode; a current driver coupled to the laser diode; a digital synthesizer for creating a modulation index signal, wherein the modulation index signal is coupled to the current driver; an analog feedback loop coupled between the back-facet photodiode and the current driver for maintaining a constant average optical power level from the laser diode; and a digital feedback loop coupled between the back-facet photodiode and the digital synthesizer for maintaining the modulation index signal between a pair of modulation threshold levels.

These are just a few of the many aspects of the invention, which are detailed below in reference to the attached drawing figure. Other aspects and variations thereof will be apparent to one of ordinary skill in this field upon reviewing this application.

BRIEF DESCRIPTION OF THE DRAWINGS

The present invention provides many advantages over presently known systems and methods in this field, as will become apparent from the following description when read in conjunction with the accompanying drawings, wherein.

DETAILED DESCRIPTION OF THE DRAWINGS

Figure 1:
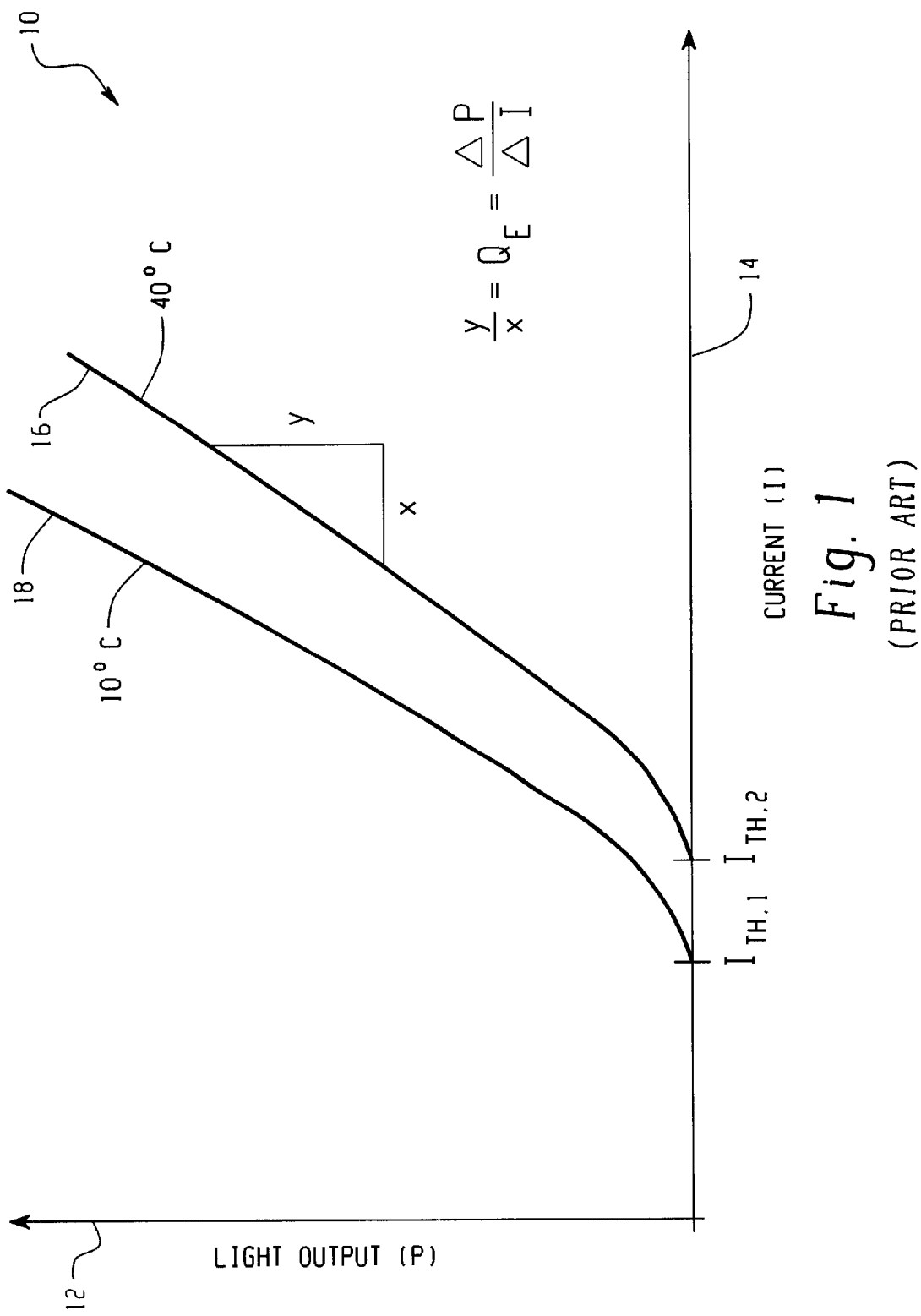
FIG. 1 is a plot showing the typical light output (P) v. current (I) characteristic for a laser diode at two operating temperatures.
Figure 2:
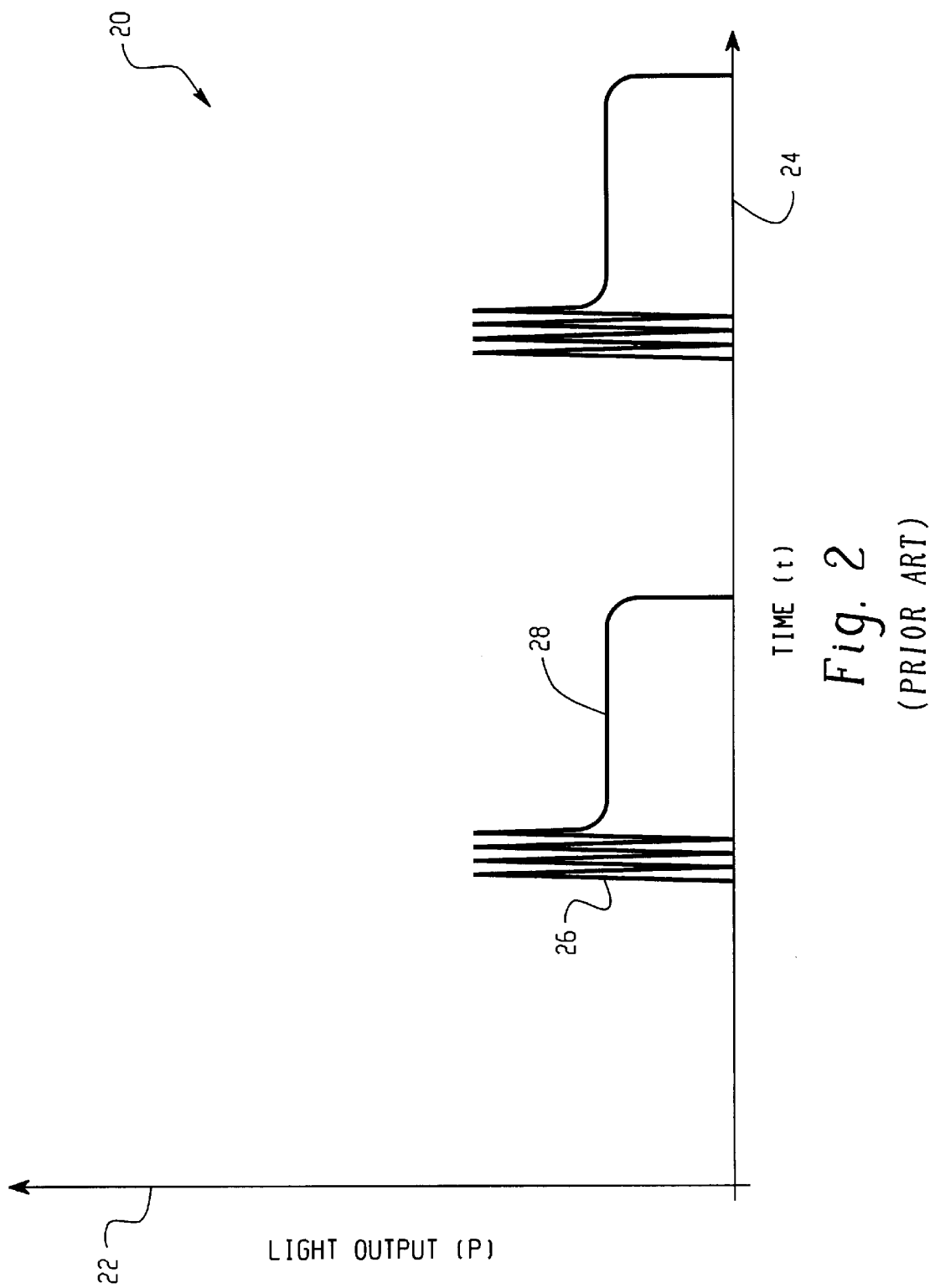
FIG. 2 is a plot showing a plurality of light pulses output from a typical prior art laser driver circuit showing a ringing phenomenon on the rising edge of the pulse.
Figure 3:
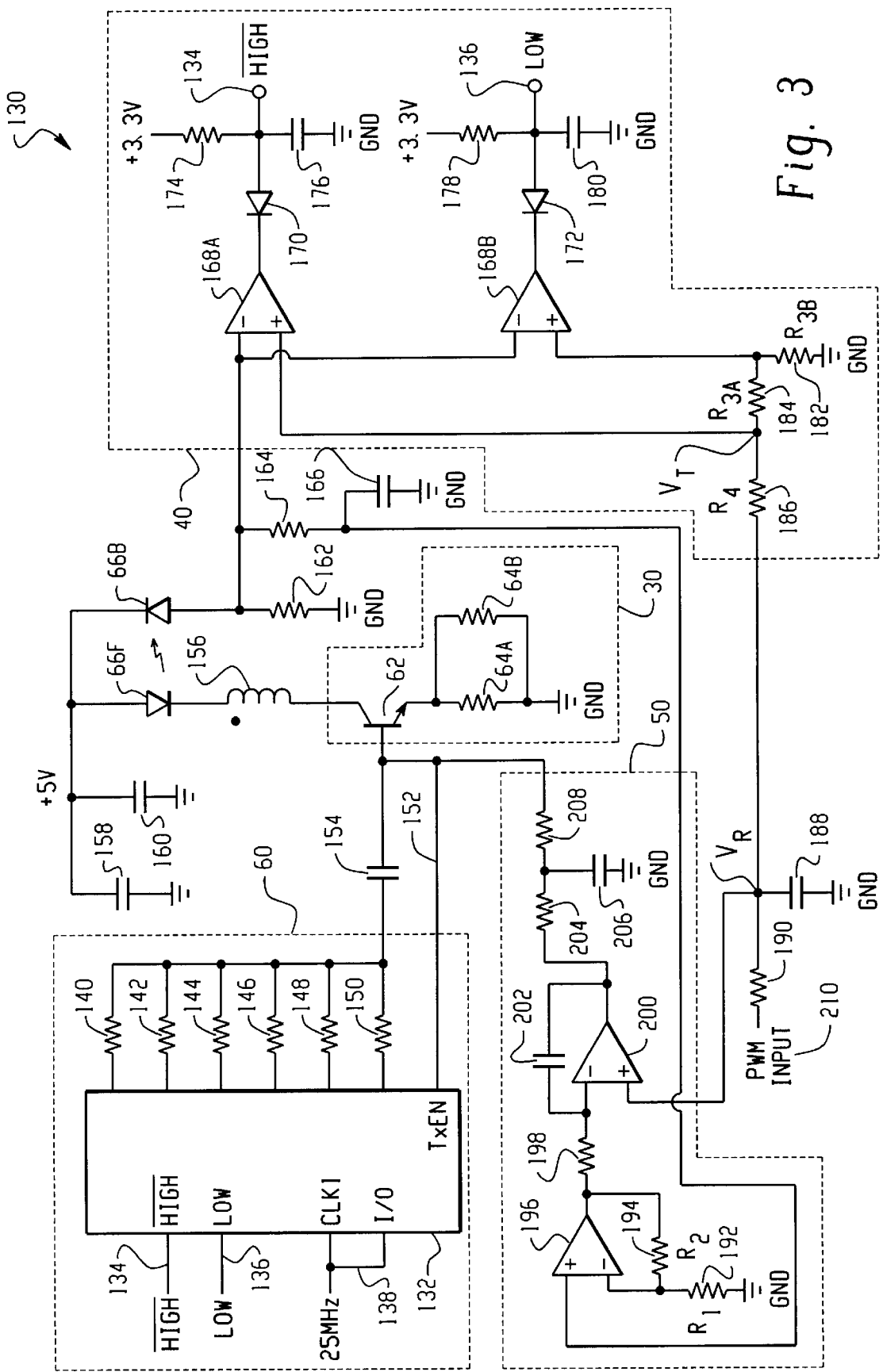
FIG. 3 is a circuit schematic showing a digital laser driver circuit according to an embodiment of the present invention.

Turning now to the drawing figures, FIG. 3 is a circuit schematic showing a digital laser driver circuit 130 according to an embodiment of the present invention. This circuit 130 includes a laser diode 66F having a back-facet monitor photodiode 66B, a current drive circuit 30, a digital feedback loop 40, an analog feedback loop 50, and a digital synthesizer 60. The laser diode 66F is preferably utilized to communicate communication pulses over an optical fiber (not shown). The laser diode also communicates an attenuated pulse of light to the back-facet photodiode 66B, which is used to monitor the operation of the laser diode 66F.

The laser diode 66F is current-driven using the current driver circuit 30, which preferably includes bipolar junction transistor (BJT) 62, resistors 64A, 64B, and ferrite bead 156. (The ferrite bead 156 is used for wave shaping of the output pulses from the laser diode 66F). The bipolar transistor 62 is driven by two signals, a first signal from the analog feedback loop 50 and a second signal from the digital synthesizer 60 that is coupled to the digital feedback loop 40. Both of the feedback loops 40, 50 are coupled to the output of the back-facet photodiode 66B, which is coupled to ground through resistor 162.

The digital synthesizer 60 includes a digital FPGA 132 and a plurality of resistors 140–150 which are coupled together at a common node and are preferably binary weighted in order to provide a synthesized output signal that drives the BJT 62. The purpose of this digital synthesizer 60 is to synthesize a modulation waveform that precisely controls the modulation index of the laser diode 66F. In addition to the plurality of digital outputs coupled to the resistors 140–150, the digital FPGA 132 includes a clock input 138, an enable input TXEN, and a pair of comparator feedback input signals HIGH 134, LOW 136.

The analog feedback loop 50 is coupled between the output of the photodiode 66B and the base of the driver BJT 62, and includes resistor 164, capacitor 166, op-amps 196 and 200, associated resistors 192 (R1), 194 (R2), 198, 204 and 208, and capacitors 202 and 206. The output of the analog feedback path 50 is also coupled to the TXEN pin 152 on the digital FPGA 132 in the digital synthesizer 60.

The digital feedback loop 40 is coupled between the output of the monitor photodiode 66B and the digital synthesizer 60, and includes comparators 168A, 168B, input PWM circuitry 190, 188, 186 (R4), 184 (R3A), 182 (R3B), diodes 170, 172, resistors 174, 178, capacitors 176, 180, high and low feedback signals 134, 136, the digital FPGA 132 and synthesizing resistors 140, 142, 144, 146, 148 and 150.

The digital feedback loop 40 is coupled to the digital synthesizer 60 in order to control the laser extinction ratio (modulation index.) In this configuration, the laser diode's back-facet photodiode 66B is used to monitor the laser's average and peak optical power. The average power level is sensed by the analog feedback loop 50 in order to maintain a constant optical power level from the laser. The peak power is compared to a ratio of the average power using digital comparators 168A, 168B of the digital feedback loop 40. These comparators indicate to the digital FPGA 132 whether the modulation index is too low or too high 134, 136. A digital logic circuit within the FPGA 132 then synthesizes the laser modulation drive signal via the binary-weighted resistors 140–150 in order to maintain the optical modulation index between these two threshold levels.

This circuit 130 preferably operates as follows. A variable Pulse Width Modulator (PWM) input communication logic signal 210 is filtered by the capacitor 188 to produce a reference voltage ($V_R$). This reference voltage sets the average optical output level desired for the laser diode 66F, and is coupled to the positive input of the second operational amplifier 200 in the analog feedback path 50. As long as $V_R$ is greater than the negative input to the second operational amplifier 200, the output voltage from the op-amp will increase the drive current supplied by the BJT 62. As the laser turns on harder, the back-facet diode 66B current will increase the voltage on the resistor 162. This voltage is then fed-back and amplified by the first operational amplifier 196 in the analog feedback path 50 and is applied through a resistor 198 to the negative input of the second operational amplifier 200. When this feedback average voltage is equal to the reference voltage, $V_R$, the circuit will be in equilibrium, and the laser drive transistor 62 will be supplying a constant current to the laser diode 66F. The resistor 198 and the capacitor 202 form a signal integrator with the second amplifier 200, in order to purposely inhibit the analog feedback path 50 from operating too rapidly.

A separate, digital feedback loop 40 is then used to control the modulation level of the laser 66F via a digital synthesizer 60. In this circuitry, the FPGA 132 synthesizes the laser drive signal using a plurality of binary-weighed resistors 140, 142, 144, 146, 148, 150. Although six weighted resistors are shown in FIG. 3, more or less could be used. The synthesized laser drive signal is input to the base of the drive transistor 62. Two comparators 168A, 168B are coupled to the output of the back-facet photodiode 66B, and are then used to determine whether the laser modulation level is too high or too low. These high/low signals 134, 136 from the two comparators 168A, 168B tell the FPGA 132 to increase the modulation, decrease the modulation, or leave it alone. A digital integrator in the FPGA 132 ramps the modulation level up or down until it is within the window specified by the two comparators 168A, 168B. The two comparators 168A, 168B compare the peak modulation signal on the resistor 162 to thresholds that are set by resistors 186, 184, and 182 based on the reference voltage $V_R$ from the PWM. This step eliminates the need for the modulation level to be calibrated independently. Once the average level is set, the modulation level is automatically set as a ratio of the average level. The following equations derive the correct resistor values corresponding to the desired modulation level (D) or optical extinction ratio ($R_E$).

$$V_T = \frac{R3}{R3+R4} \times V_R = \frac{R1}{R1+R2} \times \frac{1}{D} \times \frac{2Re}{Re+1} \times V_R \quad [1]$$

$$R3(R1+R2) \times D \times (Re+1) = 2R1 \times Re(R3+R4) \quad [2]$$

$$2R1 \times Re \times R4 = R3[(R1+R2) \times D \times (Re+1) - 2R1 \times Re] \quad [3]$$

$$R4 = R3 \times \left[ \frac{(R1+R2) \times D \times (Re+1)}{2R1 \times R3} - 1 \right] \quad [4]$$

Using these equations [1] through [4], for a modulation duty cycle (D) of 0.25 and an extinction ratio Re of 8, the values of the resistors are R1=20 kohms, R2=0.787 kohms, R3=1.09 kohms, and R4=4.7 kohms.

The diodes 170, 172 and capacitors 176, 180 to the right of the comparators 168A, 168B, filter the comparator outputs so that they do not pulse in synchronicity with the optical signal pulses from the laser diode 66F.

Although not limiting the present invention in any way, the following is a list of preferred elements for some of the circuit components shown in FIG. 3. Other component values and elements could be used in place of those shown in FIG. 3. Resistors 140, 142, 144, 146, 148, and 150 are, respectively, 4.8 kohms, 2.4 kohms, 1.2 kohms, 0.6 kohms, 0.3 kohms and 0.15 kohms. Capacitor 154 is 1000 picofarads. Transistor 62 is a BFG 235 type device. Resistors 64A, 64B are 40 ohms. Ferrite Bead 156 is 90 ohms. Resistor 162 is 1 kohm. Resistor 164 is 20 kohms. Capacitor 166 is 1000 picofarads. Comparators 168A, 168B are a Maxim MAX 902. Resistors 174, 178 are 10 kohms. Capacitors 176, 180 are 320 picofarads. Resistor R4 is 4.1 kohms. Resistor R3A is 100 ohms. Resistor R3B is 909 ohms. Capacitor 188 is a 6.8 microfarad tantalum capacitor. Resistor 190 is 5 kohms. Op-amps 196 and 200 are OP 295 type. Resistor R1 is 20 kohms. Resistor R2 is 780 kohms. Resistor 198 is 200 kohms. Capacitor 202 is 0.1 microfarads. Resistor 204 is 425 ohms. Capacitor 206 is 1000 picofarads. Resistor 208 is 75 ohms.

The preferred embodiments described with reference to the attached drawing figures are presented only to demonstrate certain examples of the invention. Other elements, steps, methods and techniques that are in substantially different from those described above and/or in the appended claims are also intended to be within the scope of the invention.

What is claimed:

1. A digital laser communication circuit, comprising:
   a laser diode;
   a back-facet photodiode for monitoring the light output from the laser diode;
   a current driver coupled to the laser diode;
   a digital synthesizer for creating a modulation index signal, wherein the modulation index signal is coupled to the current driver;
   an analog feedback circuit coupled between the back-facet photodiode and the current driver, the analog feedback circuit operable to maintain a constant average optical power level from the laser diode; and
   a digital feedback circuit coupled between the back-facet photodiode and the digital synthesizer, the digital feedback circuit operable to maintain the modulation index signal between a pair of modulation threshold levels.

2. A digital laser driver circuit for controlling the drive current to a laser diode having a back-facet monitor photodiode, comprising:
   a current driver coupled to the laser diode;
   analog feedback means for measuring the average power level of light output from the laser diode and for maintaining a constant optical power output level, the analog feedback means coupled between the back-facet photodiode and the current driver; and
   digital feedback means for comparing the peak power level of light output from the laser diode to a ratio of the average power level and for synthesizing a laser modulation level to the current driver that keeps the peak power level between two average threshold levels, the digital feedback means coupled between the back-facet photodiode and the current driver.

3. The digital laser driver circuit of claim 2, wherein the current driver comprises:
   a bipolar junction transistor having a base, an emitter, and a collector, wherein the analog and digital feedback means are coupled between the output of the back-facet monitor photodiode and the base of the bipolar transistor, and the collector is coupled to the laser diode; and
   a current setting resistor coupled between the emitter of the bipolar junction transistor and ground.

4. The digital laser driver circuit of claim 2, wherein in response to receiving a pulse-width modulation input signal the current driver pulses current to the laser diode in order to generate an optical pulse-width modulation communication signal.

5. The digital laser driver circuit of claim 2, further comprising a reference voltage circuit operable to receive a pulse-width modulation signal and generate a reference voltage to set an average optical output level of the laser diode.

6. The digital laser driver circuit of claim 5, wherein the reference voltage circuit comprises a single pole RC filter.

7. A digital laser driver circuit for controlling the drive current to a laser diode having a back-facet monitor photodiode, comprising:
   a current driver coupled to the laser diode;
   an analog feedback circuit coupled between the back-facet photodiode and the current driver operable to measure the average power level of light output from the laser diode and for maintaining a constant optical power output level, comprising a first operational amplifier configured to receive as input a first feedback signal based on an output of the back-facet monitor photodiode and a reference voltage, and output an analog feedback signal; and
   a digital feedback circuit coupled between the back-facet photodiode and the current driver operable to compare the peak power level of light output from the laser diode to a ratio of the average power level and further operable to synthesize a laser modulation level to the current driver that keeps the peak power level between two average threshold levels, comprising:
      a digital synthesizer operable to synthesize a modulation index signal which is coupled to the current driver; and
      a comparator circuit coupled between the output of the back-facet photodiode and the digital synthesizer operable to compare the peak power level of light output from the laser diode to a pair of threshold levels corresponding to a ratio of the average power level from the laser, and further operable to generate control signals to instruct the digital synthesizer to change the modulation index signal until the peak power level is between the two threshold levels.

8. The digital laser driver circuit of claim 7, wherein the analog feedback circuit further comprises a second operational amplifier configured to receive as input a voltage generated by the back-fact monitor photo diode and output the first feedback signal.

* * * * *